(12) United States Patent
Tien et al.

(10) Patent No.: US 6,284,611 B1
(45) Date of Patent: Sep. 4, 2001

(54) METHOD FOR SALICIDE PROCESS USING A TITANIUM NITRIDE BARRIER LAYER

(75) Inventors: Bor-Zen Tien, Tainan; Tzong-Sheng Chang, Chang-Hua; Chen-Cheng Chou, Taichung; Wen-Jye Yue, Yi-Lan County, all of (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/467,134

(22) Filed: Dec. 20, 1999

(51) Int. Cl.[7] .................................................. H01L 21/336
(52) U.S. Cl. .................... 438/301; 438/585; 438/660; 438/663; 438/664
(58) Field of Search ..................................... 438/660, 663, 438/664, 301, 585

(56) References Cited

U.S. PATENT DOCUMENTS

| | | | |
|---|---|---|---|
| 4,551,908 | 11/1985 | Nagasawa et al. ................. | 29/571 |
| 4,558,507 | * 12/1985 | Okabayashi et al. . | |
| 4,835,112 | 5/1989 | Pfiester et al. ........................ | 437/24 |
| 5,196,360 | * 3/1993 | Doan et al. . | |
| 5,401,674 | * 3/1995 | Anjum et al. . | |
| 5,413,957 | * 5/1995 | Byun . | |
| 5,789,318 | 8/1998 | Delfino et al. ..................... | 438/656 |
| 5,831,335 | * 11/1998 | Miyamoto ......................... | 257/757 |
| 5,858,846 | * 1/1999 | Tsai et al. ......................... | 438/303 |
| 6,008,111 | * 12/1999 | Fushida et al. ................... | 438/584 |
| 6,022,795 | * 2/2000 | Chen et al. ........................ | 438/586 |
| 6,072,222 | * 6/2000 | Nistler ............................... | 257/383 |
| 6,096,638 | * 8/2000 | Matsubara ......................... | 438/649 |

* cited by examiner

Primary Examiner—Long Pham
(74) Attorney, Agent, or Firm—George O. Saile; Stephen B. Ackerman; William J. Stoffel

(57) ABSTRACT

This invention provides a method for forming a self-aligned silicide with low sheet resistance in the N+ source and drain regions and the N+ polysilicon regions in a semiconductor device using a titanium nitride barrier layer to prevent nitridation of an underlying titanium layer during rapid thermal anneal. The process begins by providing a substrate structure having a gate thereon. A titanium layer is deposited over the substrate structure and the gate. Mixing ions are implanted through the titanium layer into source and drain regions adjacent to the gate. A titanium nitride barrier layer is deposited on the titanium layer. The substrate structure is rapid thermal annealed causing the titanium layer to react with the underlying silicon to form silicide. The substrate structure is selectively etched to remove the titanium nitride barrier layer and unreacted titanium. A second rapid thermal anneal is performed.

9 Claims, 3 Drawing Sheets

METHOD FOR SALICIDE PROCESS USING A TITANIUM NITRIDE BARRIER LAYER

BACKGROUND OF INVENTION

1) Field of the Invention

This invention relates generally to fabrication of semiconductor devices and more particularly to a method of performing a self-aligned silicide process using a titanium layer with an overlying titanium nitride barrier layer to prevent nitridation of the titanium layer during the first rapid thermal anneal step, thereby reducing the sheet resistance of the N+ source and drain regions and the N+ polysilicon.

2) Description of the Prior Art

The use of self-aligned silicide (SALICIDE) processes has resulted in higher performing, lower cost, and increased density semiconductor devices. However, sheet resistance (Rs) at the salicide interface is a key limitation of current SALICIDE processes, particularly as processing speed increases.

In current SALICIDE processes, a titanium layer is deposited over a gate and adjacent source and drain regions. The substrate is then exposed to a rapid thermal anneal (RTA) in which the titanium in areas that overlie silicon (i.e. gate electrode and source and drain regions) reacts with the silicon to form titanium silicide, and the titanium in areas that do not overlie silicon (i.e. nitride or oxide spacers and isolation structures) the titanium does not react. Unreacted titanium is then removed using a selective metal etch. Then a second RTA is performed to further lower the sheet resistance of the silicide.

The RTA steps are performed in a nitrogen containing atmosphere. During the first RTA step, the nitrogen reacts with the titanium at the surface of the titanium layer forming titanium nitride. Thus, the titanium which reacts with nitrogen is not available to form titanium silicide, and the titanium nitride prevents subsequent ion mixing step from effectively reducing the sheet resistance at the silicide interface.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,835,112 (Pfiester et al.) shows a salicide process using a Ge ion implant.

U.S. Pat. No. 4,551,908 (Nagasawa et al.) recites a salicide process with an ion mixing step.

U.S. Pat. No. 5,789,318 (Delfino et al.) shows a salicide process using a sputter deposited $TiH_{x \leq 2}$ which is converted to C-49 $TiSi_2$ and TiN during a first rapid thermal anneal.

SUMMARY OF THE INVENTION

It is an object of the present invention to provide a method for fabricating self-aligned silicide using a titanium nitride barrier layer over a titanium layer to prevent nitridation of the titanium layer during rapid thermal anneal.

It is another object of the present invention to provide a method for forming a self-aligned silicide source and drain contacts and gate contacts while maintaining low sheet resistance in the N+ source and drain regions and the N+ polysilicon.

It is yet another object of the present invention to provide a method for forming a self-aligned with reduced variation of the sheet resistance in the N+ source and drain regions and the N+ polysilicon.

To accomplish the above objectives, the present invention provides a method for forming a self-aligned silicide with low sheet resistance in the N+ source and drain regions and the N+ polysilicon regions in a semiconductor device using a titanium nitride barrier layer to prevent nitridation of an underlying titanium layer during rapid thermal anneal. The process begins by providing a substrate structure having a gate thereon. A titanium layer is deposited over the substrate structure and the gate. A blanket implant of mixing ions is performed. A titanium nitride barrier layer is deposited on the titanium layer. The substrate structure is rapid thermal annealed causing the titanium layer to react with the underlying silicon to form silicide. The substrate structure is selectively etched to remove the titanium nitride barrier layer and unreacted titanium. A second rapid thermal anneal is performed.

The present invention provides considerable improvement over the prior art. Sheet resistance for N+ source and drain regions is reduced dramatically by the present invention down to a mean of about 5.603 $\Omega/\square$ with a standard deviation of about 0.267 $\Omega/\square$ for 2 micrometer structures and a mean of about 19.48 $\Omega/\square$ with a standard deviation of 2.103 $\Omega/\square$ for 0.3 micrometer structures. Sheet resistance for N+ polysilicon regions is reduced by the present invention down to a mean of about 6.54 $\Omega/\square$ with a standard deviation of about 0.896 $\Omega/\square$.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming self-aligned silicide using a titanium nitride barrier.

Figure 1:
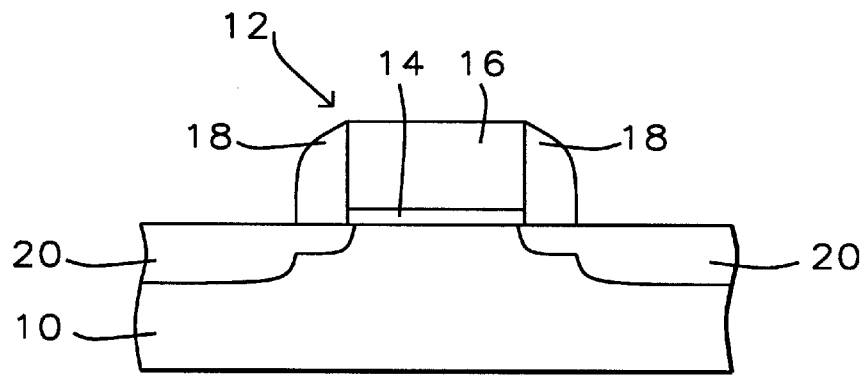
FIGS. 1, 2, 3, 4 & 5 illustrate sequential sectional views of a process for according to the invention.

Referring to FIG. 1, the process begins by providing a substrate structure (10), having a gate structure (12) thereon with sidewalls, source and drain regions (20) adjacent to the gate structure (12), and dielectric spacers (18) on the sidewalls of the gate structure (12). The gate structure is comprised of a gate dielelctric layer (14) with a gate electrode layer (16) thereover.

Figure 2:
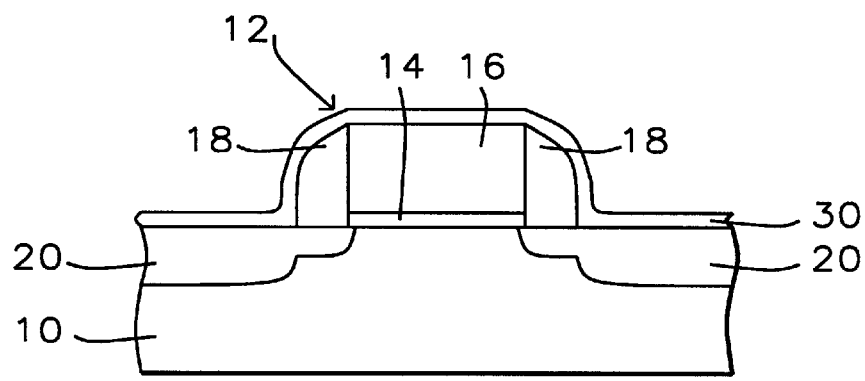

Referring to FIG. 2, a titanium layer (30) is deposited over the gate structure (12) and the substrate structure (10). The titanium layer preferably has a thickness of between about 275 Angstroms and 300 Angstroms, and is preferably deposited using a sputtering process.

Figure 3:
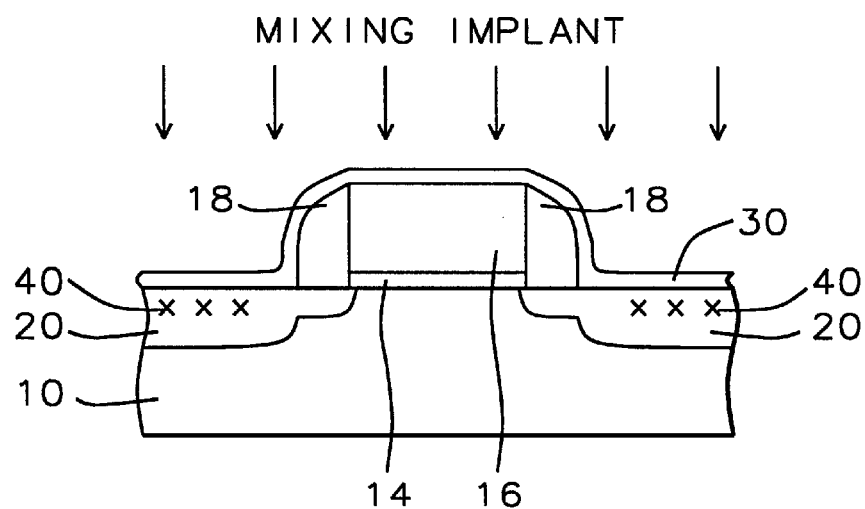
Figure 7:
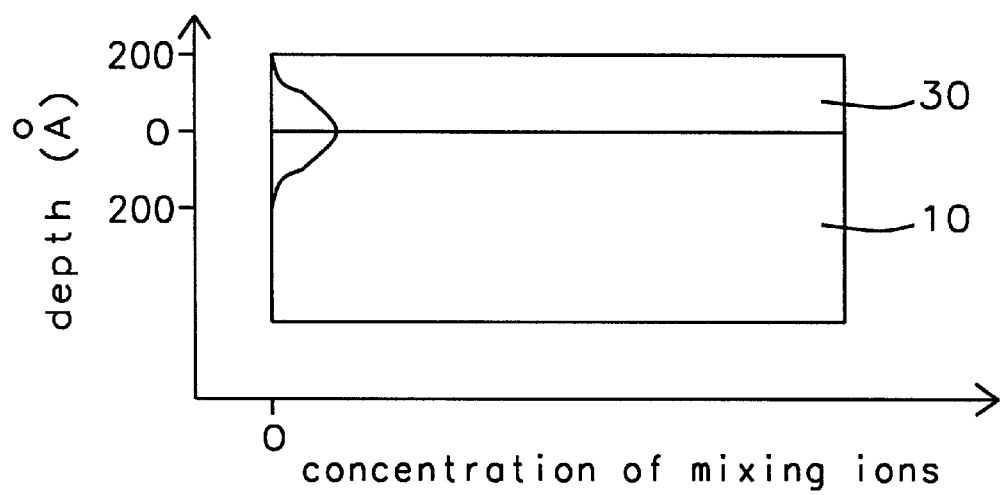
FIG. 7 shows the mixing ion concentration profile of a semiconductor device fabricating according to the present invention, following mixing ion implant.

Referring to FIG. 3, mixing ions (40) are implanted into the substrate structure (10). The mixing ions (40) can be Ge ions implanted into the substrate structure (10) at an energy of between about 50 KeV and 60 KeV and at a dose of about 5.0E14 atm/cm$^2$. Alternatively, the mixing ions (40) can be Si ions implanted into the substrate structure (10) at an energy of between about 50 KeV and 60 KeV and at a dose of between about 8.0E14 atm/cm$^2$ and 1.0E15 atm/cm$^2$. Following implantation, the mixing ion concentration profile preferably peaks at the interface of the titanium layer (10) and the substrate structure (10), as shown in FIG. 7. From the interface of the titanium layer (10) and the substrate structure (10), the mixing ion profile preferably extends down about 200 Angstroms into the substrate structure and up about 200 Angstroms into the titanium layer.

Figure 4:
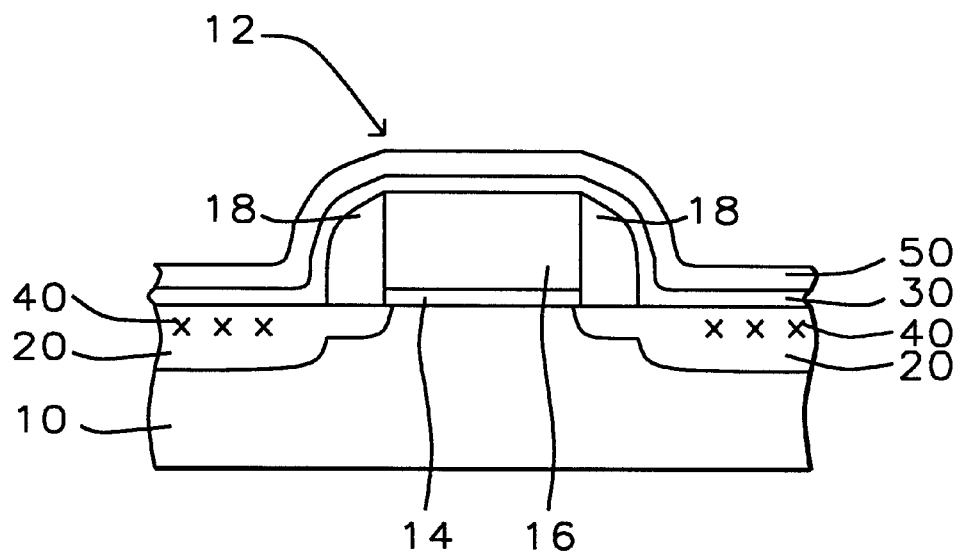

In a key step, as shown in FIG. 4, a titanium nitride barrier layer (50) is deposited over the gate structure (12) and the substrate structure (10). The titanium nitride barrier layer (50) is preferably deposited using a sputtering process. The thickness of the titanium nitride barrier layer (50) is preferably between about 200 Angstroms and 300 Angstroms.

Figure 5:
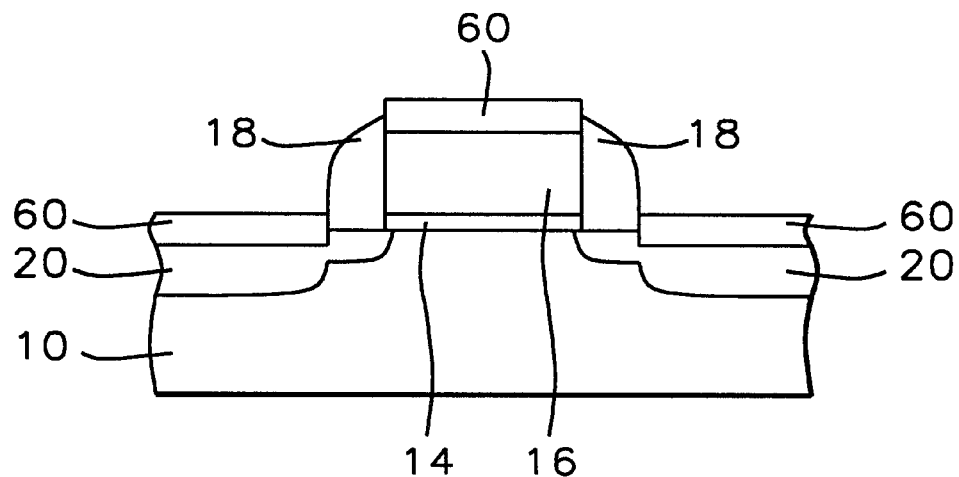

Referring to FIG. 5, a first rapid thermal anneal is performed on the substrate structure (10) to form silicide regions (60) on the source and drain regions (20). The first rapid thermal anneal is preferably performed at a temperature of between about 720° C. and 730° C. for a time of between about 30 seconds and 50 seconds.

Still referring to FIG. 5, the substrate structure (10) is selectively etched to remove the titanium nitride barrier layer (50) and unreacted titanium from the titanium layer (30). The etch is preferably performed using APM.

Still referring to FIG. 5, a second rapid thermal anneal is performed on the substrate structure (10) to change the phase of the titanium silicide from C49 to C54, providing lower resistance. The second rapid thermal anneal is preferably performed at a temperature of between about 800° C. and 900° C. for a time of between about 30 seconds and 50 seconds.

Figure 6A:
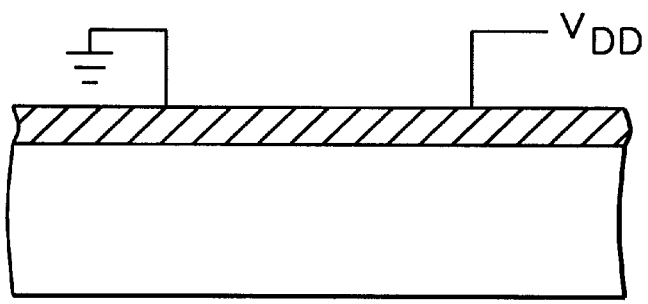
FIGS. 6A and 6B illustrate sectional views of a semiconductor device fabricated in accordance with the present invention and used for sheet resistance and junction resistance measurements respectively in a split lot experiment.
Figure 6B:
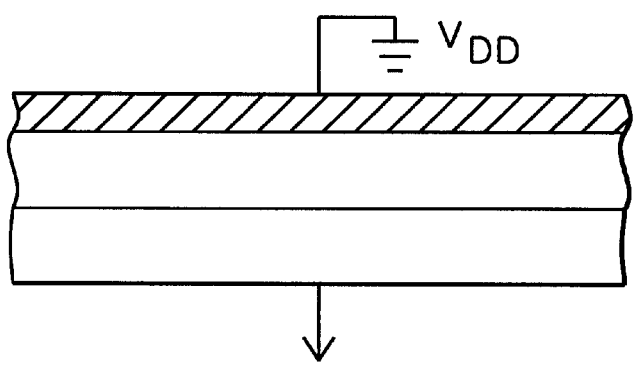

The key advantages of the present invention are that the sheet resistance is reduced dramatically for the N+ source and drain regions and the N+ polysilicon regions by the present invention. A split lot experiment was performed using semiconductor devices as shown in FIGS. 6A and 6B fabricated using a conventional salicide process and the process of the present invention. Resistance measurements are provided in Table 1. Rs__ indicates sheet resistance; Jun__ indicates junction resistance; Rc__ indicates contact resistance; and SALBRDG indicates salicide bridging (by low resistance).

As shown in FIG. 6A, sheet resistance measurements were taken by applying a voltage potential to electrodes contacting the silicide layer spaced apart a known distance. As shown in FIG. 6B, junction resistance measurements were taken by applying a voltage potential across the junction with one electrode contacting the silicide layer and the other electrode contacting the well region. For N+ doped silicon, a P-well is used. For P+ silicon an N-well is used.

While the invention has been particularly shown and described with reference to the preferred embodiments thereof, it will be understood by those skilled in the art that various changes in form and details may be made without departing from the spirit and scope of the invention.

TABLE 1

| mean/std dev($\Omega$/□) | Ti→Si mix→TiN (invention) | Ti→Si mix (conventional) | Ti→TiN→Si mix |
|---|---|---|---|
| Rs__N + (2$\mu$m) | 5.603/0.267 | 11.735/3.786 | 7.63/3.375 |
| Rs__N + (0.3 82 m) | 19.48/2.103 | 25.178/3.293 | 20.878/1.512 |
| Rs__N + Poly | 6.54/0.896 | 12.84/1.913 | 8.795/7.009 |
| Rs__P + (2$\mu$m) | 3.806/0.068 | 4.693/0.107 | 3.874/0.088 |
| Rs__P + (0.3$\mu$m) | 3.24/0.1 | 3.866/0.054 | 3.322/0.136 |
| Rs__P + Poly | 4.025/0.2 | 4.962/0.126 | 4.267/2.43 |
| Rs__Poly1 (2.0$\mu$m) | 4.419/0.03 | 5.359/0.044 | 4.342/0.135 |
| Rs__Poly2 (.24$\mu$m) | 3.429/0.143 | 4.529/0.27 | 3.977/1.276 |
| Jun__N + /N+ | 4.641/0.00062 | 4.631/0.013 | 4.57 |
| Jun__P + /P+ | −6.119/0.014 | −6.119/0.014 | −6.057/0.015 |
| Jun__N + /PW | 0.00048/1.9e-5 | 0.00045/1.6e-5 | 0.00083/7e-5 |
| Jun__P + /NW | −0.00041/1.1e-5 | −0.0004/7.4e-5 | −0.00068/2.8e-5 |
| Rc__ Intrinsic-Poly | 3.526/0.064 | 3.912/0.069 | 6.471/0.179 |
| Rc__N+ | 8.858/0.374 | 12.466/0.521 | 10.079/0.152 |
| Rc__N + Poly | 4.045/0.063 | 5.031/0.119 | 9.103/0.171 |
| Rc__P+ | 4.244/0.079 | 4.77/0.085 | 6.14/0.095 |
| Rc__P + Poly | 3.687/0.056 | 4.33/0.07 | 6.29/0.159 |
| SALBRDG__N+ | 3.396/2.578 | 4.216/2.435 | 3.3/2.366 |
| SALBRDG__P+ | −5.976/0.874 | −6.028/0.881 | −5.84/0.82 |

What is claimed is:

1. A method for forming self-aligned silicide using a titanium nitride barrier, comprising the steps of:
   a. providing a substrate structure, having a gate structure thereon with sidewalls, source and drain regions adjacent to said gate structure, and dielectric spacers on said sidewalls of said gate structure; said gate structure comprising a gate dielelctric layer with a gate electrode layer thereover;
   b. depositing a titanium layer having a thickness of between about 275 and 300 angstroms over said gate structure and said substrate structure;
   c. implanting mixing ions into said substrate structure and said titanium layer;
   d. depositing a titanium nitride barrier layer having a thickness of between about 200 and 300 angstroms over said gate structure and said substrate structure;
   e. performing a first rapid thermal anneal on said substrate structure; thereby forming silicide regions;
   f. performing a selective etch on said substrate structure to remove said titanium nitride barrier layer and unreacted titanium from said titanium layer; and
   g. performing a second rapid thermal anneal on said substrate structure.

2. The method of claim 1 wherein said mixing ions are Ge ions implanted into said substrate structure at an energy of between about 50 KeV and 60 KeV and at a dose of between about 5.0E14 atm/cm$^2$ and 7.0E14 atm/cm$^2$.

3. The method of claim 1 wherein said mixing ions are Si ions implanted into said substrate structure at an energy of between about 50 KeV and 60 KeV and at a dose of between about 8.0E14 atm/cm$^2$ and 1.0E15 atm/cm$^2$.

4. A method for forming self-aligned silicide using a titanium nitride barrier layer, comprising the steps of:
   a. providing a substrate structure, having a gate structure thereon with sidewalls, source and drain regions adjacent to said gate structure, and dielectric spacers on said sidewalls of said gate structure; said gate structure comprising a gate dielelctric layer with a gate electrode layer thereover;

b. depositing a titanium layer having a thickness of between about 275 Angstroms and 300 Angstroms over said gate structure and said substrate structure;

c. implanting mixing ions into said substrate structure; thereby forming a mixing ion concentration profile peaking at the interface of said titanium layer and said substrate structure and extending upward into said titanium layer a distance of about 200 Angstroms and extending downward into said substrate structure a distance of about 200 Angstrams;

d. depositing a titanium nitride barrier layer having a thickness of between 200 Angstroms and 300 Angstroms over said gate structure and said substrate structure;

e. performing a first rapid thermal anneal on said substrate structure;

f. performing a selective etch on said substrate structure to remove said titanium nitride barrier layer and unreacted titanium from said titanium layer; and g. performing a second rapid thermal anneal on said substrate structure.

5. The method of claim 4 wherein said mixing ions are Ge ions implanted into said substrate structure at an energy of between about 50 KeV and 60 KeV and at a dose of between about 5.0E14 atm/cm$^2$ and 7.0E14 atm/cm$^2$.

6. The method of claim 4 wherein said mixing ions are Si ions implanted into said substrate structure at an energy of between about 50 KeV and 60 KeV and at a dose of between about 8.0E14 atm/cm$^2$ and 1.0E15 atm/cm$^2$.

7. The method of claim 4 wherein said titanium nitride barrier layer is formed using a sputtering process.

8. The method of claim 4 wherein said first rapid thermal anneal is performed at a temperature of between about 720° C. and 730° C. for a time of between about 30 seconds and 50 seconds and said second rapid thermal anneal is performed at a temperature of between about 800° C. and 900° C. for a time of between about 30 seconds and 50 seconds.

9. A method for forming self-aligned silicide using a titanium nitride barrier layer, comprising the steps of:

a. providing a substrate structure, having a gate structure thereon with sidewalls, source and drain regions adjacent to said gate structure, and dielectric spacers on said sidewalls of said gate structure; said gate structure comprising a gate dielelctric layer with a gate electrode layer thereover;

b. depositing a titanium layer having a thickness of between about 275 Angstroms and 300 Angstroms over said gate structure and said substrate structure using a sputtering process;

c. implanting Ge or Si mixing ions into said substrate structure; thereby forming a mixing ion concentration profile peaking at the interface of said titanium layer and said substrate structure and extending upward into said titanium layer a distance of about 200 Angstroms and extending downward into said substrate structure a distance of about 200 Angstrams;

d. depositing a titanium nitride barrier layer having a thickness of between 200 Angstroms and 300 Angstroms over said gate structure and said substrate structure using a sputtering process;

e. performing a first rapid thermal anneal on said substrate structure at a temperature of between about 720° C. and 730° C. for a time of between about 30 seconds and 50 seconds in a nitrogen containing atmosphere;

f. performing a selective etch on said substrate structure to remove said titanium nitride barrier layer and unreacted titanium from said titanium layer; and g. performing a second rapid thermal anneal on said substrate structure at a temperature of between about 800° C. and 900° C. for a time of between about 30 seconds and 50 seconds in a nitrogen containing atmosphere.

\* \* \* \* \*